(12) United States Patent
Shinozaki et al.

(10) Patent No.: US 6,683,332 B2
(45) Date of Patent: Jan. 27, 2004

(54) HETEROJUNCTION BIPOLAR TRANSISTOR AND MANUFACTURING METHOD THEREFOR INCLUDING ELECTRODE ALLOYED REACTION LAYERS

(75) Inventors: Toshiyuki Shinozaki, Tenri (JP); Toshiya Tsukao, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 130 days.

(21) Appl. No.: 09/775,593

(22) Filed: Feb. 5, 2001

(65) Prior Publication Data

US 2001/0046747 A1 Nov. 29, 2001

(30) Foreign Application Priority Data

Apr. 19, 2000 (JP) ........................................ 2000-118231

(51) Int. Cl.7 ................. H01L 31/0328; H01L 31/0336; H01L 31/072; H01L 31/109; H01L 27/082
(52) U.S. Cl. ........................ 257/186; 257/197; 257/198; 257/584; 257/587; 257/745
(58) Field of Search ................. 257/197, 198, 257/186, 584, 587; 438/309, 312, 378

(56) References Cited

U.S. PATENT DOCUMENTS

| 5,106,771 A | * | 4/1992 | Emerson et al. ............. 438/573 |
| 5,442,194 A | * | 8/1995 | Moise .......................... 257/29 |
| 5,682,046 A | | 10/1997 | Takahashi et al. ........... 257/198 |
| 5,719,415 A | | 2/1998 | Yagura et al. ............... 257/191 |
| 5,840,612 A | | 11/1998 | Oki et al. ..................... 438/312 |
| 5,907,165 A | | 5/1999 | Hamm et al. ............... 257/197 |
| 6,043,520 A | | 3/2000 | Yamamoto et al. .......... 257/198 |

FOREIGN PATENT DOCUMENTS

| JP | 8-222526 | 8/1996 | |
| JP | 10-154714 | 6/1998 | ......... H01L/21/331 |

OTHER PUBLICATIONS

S. Hongo et al.; "Highly Reproducible Fabrication Process for Passivated AlGaAs/GaAs HBT's with Pt/Ti/Pt/Au Base Electrodes" Extended Abstracts of the 1994 International Conference on Solid State Devices and Materials, Yokohama, 1994, pp. 613–615.

E. Zanoni et al.; "Negative Base Current and Impact Ionization Phenomena in AlGaAs/GaAs HBT's" IEEE Electron Device Letters, vol. 13, No. 5, May 1992.

\* cited by examiner

*Primary Examiner*—Olik Chaudhuri
*Assistant Examiner*—William M. Brewster
(74) *Attorney, Agent, or Firm*—Nixon & Vanderhye P.C.

(57) ABSTRACT

A Pt alloyed reaction layer is formed under a base ohmic electrode. This alloyed reaction layer extends through a base protective layer so as to reach a base layer. Besides, a Pt alloyed reaction layer is formed under an emitter ohmic electrode. This alloyed reaction layer is formed only within a second emitter contact layer. With this constitution, the manufacturing cost for the HBT can be reduced and successful contact characteristics for the HBT can be obtained.

12 Claims, 11 Drawing Sheets

HETEROJUNCTION BIPOLAR TRANSISTOR AND MANUFACTURING METHOD THEREFOR INCLUDING ELECTRODE ALLOYED REACTION LAYERS

BACKGROUND OF THE INVENTION

The present invention relates to a heterojunction bipolar transistor (hereinafter, referred to as HBT) and a manufacturing method therefor.

Together with the functional improvement of digital portable telephones, there has been a demand for even higher performance of transmission-use high-power amplifiers. The HBT is regarded as promising in the field of high-frequency devices. For further higher performance of the HBT, it is necessary to reduce the parasitic device effects, i.e., parasitic resistance and parasitic capacitance. The parasitic resistance can be classified roughly into emitter resistance, base resistance and collector resistance. In particular, the emitter resistance tends to increase together with decreasing emitter dimensions intended for higher performance. This leads to noticeable deterioration of current amplification rate and cutoff frequency of the HBT.

Conventionally, GaAs based HBTs have been provided, where in the case of npn type, the n-type emitter ohmic electrode is provided by using AuGe based metals, W or other high melting point metals, WN or other high melting point nitrides and WSi or other high melting point silicides, the p-type base ohmic electrode is provided by using Pt, Pd, AuZn, AuBe or the like, and the n-type collector ohmic electrode is provided by using AuGe based metals. Examples of such an HBT and an ohmic electrode used therefor are shown in the following figures (1)–(3):

(1) FIG. 14 is a schematic sectional, structural view of main part of an HBT disclosed in Reference, S. Hongo et al., SSDM, 1994, pp. 613–615. In FIG. 14, a semi-insulating substrate and an n-type collector contact layer formed on the semi-insulating substrate and having a high carrier concentration are omitted.

On the collector contact layer, as shown in FIG. 14, a low-concentration n-type collector layer 40, a high-concentration p-type base layer 41, a low-concentration n-type emitter layers 42, 43, and a high-concentration n-type emitter contact layer 44 are formed one by one. Further, on the high-concentration n-type emitter contact layer 44 is formed an emitter ohmic electrode 46. Also, on base protective layers 45 which are both end portions of the low-concentration n-type emitter layer 42, are formed base ohmic electrodes 47, 47. Alloyed reaction layers 48, 48 are formed between these base ohmic electrodes 47, 47 and the high-concentration p-type base layer 41, and device isolating layers 49, 49 are formed so as to sandwich the base layer 41 and the emitter layer 42. The alloyed reaction layers 48, 48 extend through the base protective layers 45, 45 to connect the base ohmic electrodes 47, 47 and the base layer 41 to each other.

The base protective layers 45, 45 formed so as to cover the base layer except its portion placed just under the emitter layer 43 (hereinafter, referred to as external base) out of the base layer 41 are provided in order to suppress decreases of the current amplification rate. That is, when the surface of the external base out of the high-concentration p-type base layer 41 is not covered by the base protective layers 45, a multiplicity of interfacial levels present at the surface causes carrier recombination to occur at the surface of the external base out of the base layer 41, incurring a deterioration of the current amplification rate. However, by the base protective layers 45 covering the surface of the external base out of the base layer 41, these base protective layers 45 are completely depleted during the device operation, so that the supply of carriers to the base protective layers 45 is cut off. As a result, the recombination of carriers is suppressed at the high-concentration p-type base layer 41 so that the deterioration of the current amplification rate can be suppressed.

However, when the base ohmic electrodes 47 of the high-concentration p-type base layer 41 are formed, the surface of the external base out of the base layer 41 is covered with the base protective layers 45, keeping the high-concentration p-type base layer 41 and the ohmic electrodes 47 from making contact with each other, with the result that an ohmic contact cannot be obtained. Therefore, Pt alloyed reaction layers 48, 48 are formed by forming Pt/Ti/Pt/Au one by one and then subjecting these to heat treatment, and further the high-concentration p-type base layer 41 and the base ohmic electrodes 47, 47 are put into contact with each other by the Pt alloyed reaction layers 48, 48, by which an ohmic contact is obtained. In this case, the Pt alloyed reaction layers 48, 48 are required to extend through the base protective layers 45 and reach the high-concentration p-type base layer 41. Also, the emitter ohmic electrode 46 is formed of Ti/Pt/Au by a process other than the process for the base ohmic electrodes 47, 47. Although not shown, the collector ohmic electrode is a AuGe based electrode.

(2) FIG. 15 is a schematic sectional view of main part of an HBT disclosed in Reference, E Zanoni et al., IEEE Device Letters, Vol. 13, No. 5, May 1992. In this HBT, as shown in FIG. 15, on a semi-insulating substrate 50 are formed an n-type GaAs collector contact layer 51, an n-type GaAs collector layer 52, a p-type GaAs base layer 53, a non-doped GaAs layer 54, an n-type AlGaAs emitter layers 55, 56, 57, an n-type GaAs emitter contact layer 58, an n-type InGaAs emitter contact layers 59, 60, one by one. Also, a base ohmic electrode 61 for the p-type base layer 53 is formed of AuBe, an emitter ohmic electrode 62 for the n-type emitter layers 55, 56, 57, as well as a collector ohmic electrode 63 for the n-type collector layer 52 are formed of AuGeNi. Accordingly, the emitter ohmic electrode 62 and the collector ohmic electrode 63 can be formed simultaneously. That is, the emitter ohmic electrode 62 and the collector ohmic electrode 63 can be formed by one manufacturing step.

(3) FIGS. 16A, 16B and 16C are schematic sectional views of an ohmic electrode disclosed in Japanese Patent Laid-Open Publication HEI 8-222526. As shown in FIG. 16A, a Cu layer 71, a Ge layer 72 and Cu layer 73 are stacked one by one on a high-concentration n- or p-type GaAs layer 70, and an ohmic electrode is obtained by annealing these layers. Also, as shown in FIG. 16B, a Pd layer 75, a Cu layer 76, a Ge layer 77 and a Cu layer 78 are stacked one by one on a high-concentration n- or p-type layer 74, and an ohmic electrode is obtained by annealing these layers. Further, as shown in FIG. 16C, a Cu layer 80, a Pd layer 81, a Ge layer 82 and a Cu layer 83 are stacked one by one on a high-concentration n- or p-type GaAs layer 79, and an ohmic electrode is obtained by annealing these layers. The ohmic electrodes of FIGS. 16A, 16B and 16C can be used as ohmic portions for the high-concentration p-type GaAs layers and the high-concentration n-type GaAs layers in the HBTs. Therefore, ohmic portions for the high-concentration p-type GaAs layers and the high-concentration n-type GaAs layers can be formed by one manufacturing step, thereby facilitating the formation process for the ohmic portions.

However, the HBTs as described in (1), (2) and (3) and the ohmic electrodes to be used therefor have the following problems.

With regard to (1), the process for forming the emitter ohmic electrode 46, the base ohmic electrodes 47 and the collector ohmic electrode includes a resist formation step for forming photoresist of a pattern corresponding to the configuration of the ohmic electrodes, a metal thin film formation step for forming a metal thin film by using vapor deposition or sputtering process, and a so-called lift-off step for leaving the metal thin film only at necessary portions by removing the photoresist. Also, the base ohmic electrodes 47 are formed of Pt/Ti/Pt/Au, the emitter ohmic electrode 46 is formed of Ti/Pt/Au, and the collector ohmic electrode is formed of AuGe. Therefore, the emitter ohmic electrode 46, the base ohmic electrodes 47 and the collector ohmic electrode cannot be formed simultaneously. As a result, the emitter ohmic electrode 46, the base ohmic electrodes 47 and the collector ohmic electrode need to be manufactured by different processes, making it necessary to perform the resist formation step, the metal thin film formation step and the lift-off step for each of the emitter ohmic electrode 46, the base ohmic electrodes 47 and the collector ohmic electrode. This leads to a problem that the manufacturing cost would increase with increasing number of manufacturing steps. Moreover, use of expensive materials such as Pt and Au causes the manufacturing cost to further increase.

With regard to (2), the emitter ohmic electrode 62 and the collector ohmic electrode 63, which are formed of AuGeNi, can be formed by one manufacturing step at the same time. However, in such Au-based ohmic electrodes as the AuGeNi-based one, performing heat treatment may cause the electrode metals to react nonuniformly and flocculate into island-like shapes, resulting in nonuniform ohmic contacts within the electrode regions. In such a case, the ohmic contact resistance would not lower enough, and the emitter resistance and the collector resistance would increase. This leads to a problem that the current amplification rate and the cutoff frequency are deteriorated, in particular, because of increase in the emitter resistance. The emitter resistance tends to further increase by scale-down of the emitter size intended for higher performance.

With regard to (3), the contact resistivity of ohmic electrodes after annealing is about $1\times10^{-6}$ $\Omega cm^2$ for p-type GaAs, but it is $1\times10^{-5}$ $\Omega cm^2$, one digit higher, for n-type GaAs. Therefore, when these ohmic electrodes are used for an npn-type HBT, the emitter resistance especially of n type increases, leading to a problem that the current amplification rate and the cutoff frequency are deteriorated, as in the case of (2).

The cutoff frequency $f_T$ of an HBT can be expressed as $$f_T = \{2\pi(\tau E + \tau B + \tau C + (RE+RC)Cbc)\}^{-1} \qquad \text{Eq. (1)}$$

where, in Equation 1, $\tau E$ is the time constant of the emitter, $\tau B$ is the base running time, $\tau C$ is the collector running time, RE is the emitter resistance, RC is the collector resistance, and Cbc is the base-collector capacity.

It can be understood from Equation (1) that decreases of the emitter resistance RE and the collector resistance RC are effective for improvement of the cutoff frequency $f_T$. A decrease of the collector resistance RC can be obtained by making the collector part sufficiently thick to lower the sheet resistance of the collector. Therefore, it is the emitter resistance RE that demands special consideration. Since the emitter size will be further scaled down for higher performance in the future, a contact resistivity of $1\times10^{-6}$ $\Omega cm^2$ or less is essential also for n-type GaAs.

SUMMARY OF THE INVENTION

It is therefore an object of the present invention to provide an HBT, as well as a manufacturing method therefor, which allows the manufacturing cost to be decreased and which shows a successful contact characteristic.

In order to achieve the above object, there is provided a heterojunction bipolar transistor comprising: a low-concentration n-type collector layer formed a semi-insulating substrate; a high-concentration p-type base layer formed on the collector layer; a low-concentration n-type emitter layer formed on the base layer; a base ohmic electrode which is made of a single layer or a plurality of layers and which is formed on a base protective layer that is a portion of the emitter layer; a high-concentration n-type emitter contact layer formed so as to cover regions of the emitter layer except the base protective layer; and an emitter ohmic electrode which is made of a single layer or a plurality of layers and which is formed on the emitter contact layer, further comprising:

a base-use alloyed reaction layer formed under the base ohmic electrode, and an emitter-use alloyed reaction layer formed under the emitter ohmic electrode, wherein the base-use alloyed reaction layer extends through the base protective layer so as to reach the base layer and the emitter-use alloyed reaction layer is formed only within the emitter contact layer.

In the HBT of this construction, the base ohmic electrode is connected to the high-concentration p-type base layer through the base-use alloyed reaction layer, and the emitter ohmic electrode is connected to the higher-concentration n-type emitter contact layer through the emitter-use alloyed reaction layer. In this case, the base-use alloyed reaction layer extends through the base protective layer, reaching the base layer, while the emitter-use alloyed reaction layer is formed only within the emitter contact layer, not extending through the emitter contact layer.

Thus, by virtue of the arrangements that the emitter-use alloyed reaction layer is formed only within the higher-concentration n-type emitter contact layer and that the base-use alloyed reaction layer extends through the base protective layer to reach the high-concentration p-type base layer, the barrier width of the junction between the high-concentration n-type emitter contact layer and the emitter-use alloyed reaction layer becomes narrow and the barrier width of the junction between the high-concentration p-type base layer and the base-use alloyed reaction layer becomes narrow, allowing the carriers to pass freely through the barriers by the tunneling effect. Accordingly, the base ohmic electrode and the emitter ohmic electrode show successful ohmic characteristics so that the emitter resistance is decreased, making is possible to improve the current amplification rate and the cutoff frequency.

In one embodiment of the present invention, the base ohmic electrode and the emitter ohmic electrode are made of an identical material.

In the HBT of this one embodiment, since the base ohmic electrode and the emitter ohmic electrode are made of an identical material, the base ohmic electrode and the emitter ohmic electrode can be manufactured by one manufacturing step. Accordingly, the number of manufacturing steps is decreased, so that the manufacturing cost can be reduced.

In one embodiment of the present invention, the emitter contact layer is composed of a first emitter contact layer and a second emitter contact layer formed on the first emitter contact layer;

carrier concentration of the second emitter contact layer is set so as to be higher than carrier concentration of the first emitter contact layer; and the emitter-use alloyed reaction layer is formed only within the second emitter contact layer.

In the HBT of this one embodiment, since the emitter-use alloyed reaction layer is formed only within the second emitter contact layer having a carrier concentration even higher than the carrier concentration of the first emitter contact layer, the barrier width of the junction between the higher-concentration second emitter contact layer and the emitter-use alloyed reaction layer becomes even narrower, so that the emitter ohmic electrode shows more successful ohmic characteristics. Accordingly, the resistance of the emitter ohmic electrode, i.e., the emitter resistance is decreased, making is possible to improve the current amplification rate and the cutoff frequency.

In one embodiment of the present invention, the collector layer and the base layer are formed of GaAs and the emitter layer and the base protective layer are formed of AlGaAs.

In the HBT of this one embodiment, the arrangement that the collector layer and the base layer are formed of GaAs while the emitter layer and the base protective layer are formed of AlGaAs is desirable for improvement of the current amplification rate and the cutoff frequency.

In one embodiment of the present invention, the first emitter contact layer is formed of GaAs and the second emitter contact layer is formed of InGaAs.

In the HBT of this one embodiment, the arrangement that the first emitter contact layer is formed of GaAs while the second emitter contact layer is formed of InGaAs is desirable for improvement of the current amplification rate and the cutoff frequency.

In one embodiment of the present invention, the base ohmic electrode and the emitter ohmic electrode, or a lowermost layer of the base ohmic electrode and a lowermost layer of the emitter ohmic electrode are made of Pt; and the base-use alloyed reaction layer and the emitter-use alloyed reaction layer contain Pt.

In the HBT of this one embodiment, the base ohmic electrode and the emitter ohmic electrode, or the lowermost layer of the base ohmic electrode and the lowermost layer of the emitter ohmic electrode are made of Pt, while the base-use alloyed reaction layer and the emitter-use alloyed reaction layer contain Pt. This is desirable for improvement of the current amplification rate and the cutoff frequency.

Also, there is provided a method for manufacturing the heterojunction bipolar transistor as defined in claim 3, comprising the steps of:

stacking, on the base protective layer and the second emitter contact layer, an electrode material that makes the base ohmic electrode and the emitter ohmic electrode, or an electrode material Pt that makes a lowermost layer of the base ohmic electrode and a lowermost layer of the emitter ohmic electrode, so that a film thickness of the electrode material becomes thinner than a film thickness of the second emitter contact layer; and subjecting the electrode material to a heat treatment to form the base ohmic electrode on the base protective layer and form the emitter ohmic electrode on the second emitter contact layer.

In the HBT manufacturing method of this constitution, the electrode material is stacked on the emitter contact layer and the base protective layer so as to be thinner than the film thickness of the second emitter contact layer. Thereafter, the electrode material is subjected to a heat treatment, by which a base ohmic electrode is formed on the base protective layer and an emitter ohmic electrode is formed on the second emitter contact layer. In this process, a base-use alloyed reaction layer is formed under the base ohmic electrode, and an emitter-use alloyed reaction layer is formed under the emitter ohmic electrode. The base-use alloyed reaction layer extends through the base protective layer, reaching the high-concentration p-type base layer, while the emitter-use alloyed reaction layer is formed only within the high-concentration n-type emitter contact layer. Thus, by making the film thickness of the electrode material thinner than the film thickness of the second emitter contact layer, it becomes possible to make the base-use alloyed reaction layer extend up to the high-concentration p-type base layer and besides to form the emitter-use alloyed reaction layer only within the high-concentration n-type emitter contact layer. As a result of this, the base ohmic electrode and the emitter ohmic electrode can be improved in contact.

In one embodiment of the present invention, the film thickness of the second emitter contact layer is set to three or more times the film thickness of the electrode material Pt.

With the HBT manufacturing method of this one embodiment, it has been found out that by setting the film thickness of the second emitter contact layer to three or more times the film thickness of the electrode material, the emitter-use alloyed reaction layer to be formed by subjecting the electrode material to the heat treatment can be prevented from extending through the second emitter contact layer.

In one embodiment of the present invention, the film thickness of the electrode material is within a range defined by a following relational expression:

(film thickness of the base protective layer$\times \frac{1}{2}$)<film thickness of the electrode material before heat treatment<{(film thickness of the base protective layer+film thickness of the base layer)$\times \frac{1}{3}$}.

With this HBT manufacturing method of this one embodiment, it has been found out that by setting the film thickness of the electrode material to within such a range that the above relational expression is satisfied, the contact resistance of the base ohmic electrode can be decreased and besides that the base-use alloyed reaction layer to be formed by the heat treatment can be prevented from extending through the base layer.

It has also been found out that when the film thickness of the electrode material before the heat treatment is less than ½ of the film thickness of the base protective layer, the contact resistance of the base ohmic electrode becomes higher.

Further, it has been found out that when the film thickness of the electrode material before the heat treatment is thicker than ⅓ of {film thickness of the base protective layer+film thickness of the base layer}, the base-use alloyed reaction layer to be formed by the heat treatment extends through the base layer so as to reach the collector layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, an HBT of the present invention as well as a manufacturing method therefor, are described in detail by way of embodiments thereof illustrated in the accompanying drawings.

Figure 1:
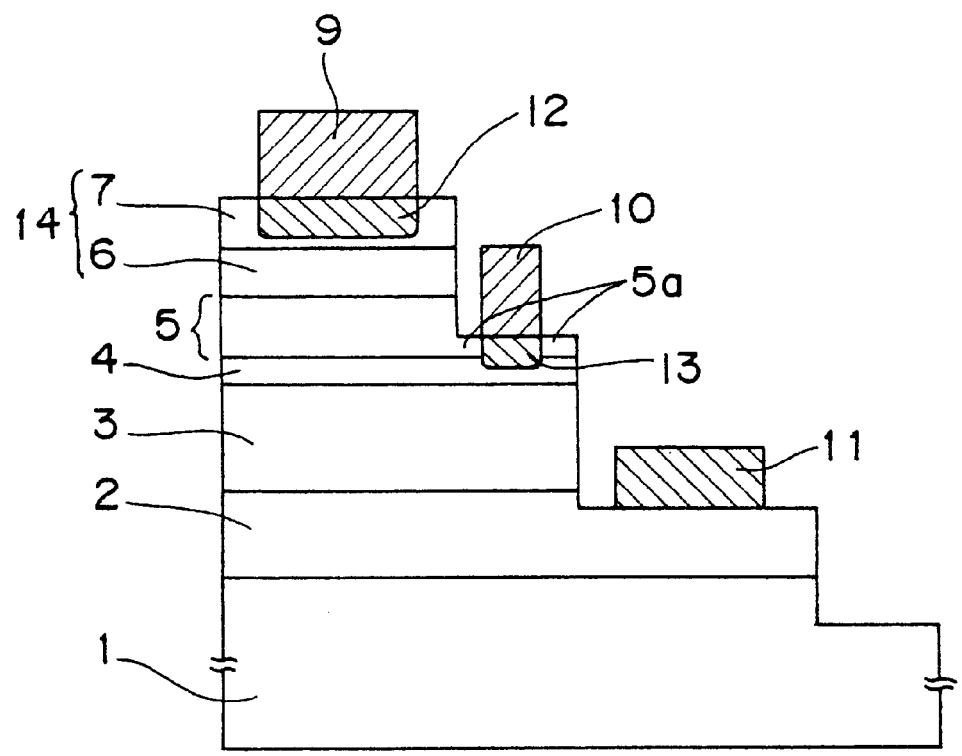
FIG. 1 is a schematic sectional view of an HBT according to an embodiment of the present invention.

FIG. 1 is a schematic sectional view of an HBT according to an embodiment of the present invention. The HBT, as shown in FIG. 1, has a high-concentration n-type GaAs collector contact layer 2 formed on a semi-insulating GaAs substrate 1 as a semi-insulating substrate, a low-concentration n-type GaAs collector layer 3 formed on a collector formation region in the collector contact layer 2, a high-concentration p-type GaAs base layer 4 formed on the collector layer 3, a low-concentration n-type AlGaAs emitter layer 5 formed on the base layer 4, a base ohmic electrode 10 of Pt/Ti/Pt/Au formed on a low-concentration n-type AlGaAs base protective layer 5a which is a portion of the emitter layer 5, a high-concentration n-type emitter contact layer 14 formed so as to cover regions of the emitter layer 5 except the base protective layer 5a, and an emitter ohmic electrode 9 of Pt/Ti/Pt/Au formed on the emitter contact layer 14. Further, on the collector contact layer 2, a collector ohmic electrode 11 of AuGe/Ni/Au is formed on the surface except the collector formation region.

Also, the emitter contact layer 14 is composed of a first emitter contact layer 6, and a second emitter contact layer 7 formed on the first emitter contact layer 6. The first emitter contact layer 6 is made of GaAs and the second emitter contact layer 7 is made of InGaAs. The first emitter contact layer 6 and the second emitter contact layer 7 are both high in concentration, where the second emitter contact layer 7 is higher in carrier concentration than the first emitter contact layer 6.

Under the base ohmic electrode 10 is formed a Pt alloyed reaction layer 13 as a base-use alloyed reaction layer. This alloyed reaction layer 13 extends through the base protective layer 5a, reaching the base layer 4. Further, under the emitter ohmic electrode 9 is formed a Pt alloyed reaction layer 12 as an emitter-use alloyed reaction layer. This alloyed reaction layer 12 is formed only within the second emitter contact layer 7.

In the HBT of this construction, the base ohmic electrode 10 is connected to the high-concentration p-type base layer 4 through the Pt alloyed reaction layer 13, and the emitter ohmic electrode 9 is connected to the higher-concentration second emitter contact layer 7 through the Pt alloyed reaction layer 12. In this case, the Pt alloyed reaction layer 13 under the base ohmic electrode 10 extends through the base protective layer 5a, reaching the base layer 4, while the Pt alloyed reaction layer 12 under the emitter ohmic electrode 9 is formed only within the second emitter contact layer 7, not extending through the second emitter contact layer 7.

Thus, by virtue of the arrangements that the Pt alloyed reaction layer 13 under the base ohmic electrode 10 extends through the base protective layer 5a to reach the high-concentration p-type base layer 4 and that the Pt alloyed reaction layer 12 under the emitter ohmic electrode 9 is formed only within the higher-concentration second emitter contact layer 7, the barrier width of the junction between the base layer 4 and the alloyed reaction layer 13 becomes narrow and the barrier width of the junction between the second emitter contact layer 7 and the alloyed reaction layer 12 becomes even narrower, allowing the carriers to pass freely through the barriers by the tunneling effect. Accordingly, the base ohmic electrode 10 and the emitter ohmic electrode 9 show more successful ohmic characteristics so that the emitter resistance is further decreased, making is possible to improve the current amplification rate and the cutoff frequency.

This HBT is manufactured as follows.

Figure 2:
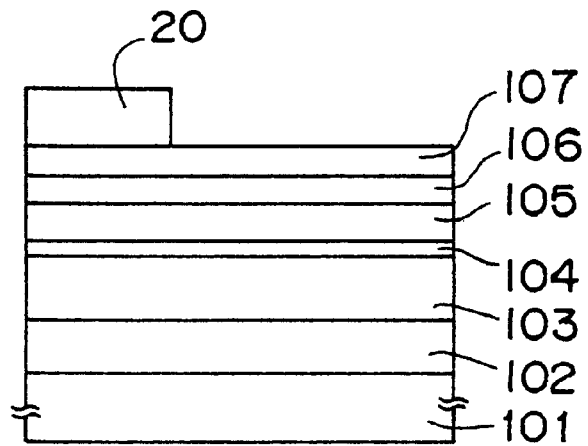
FIG. 2 is a view showing one of manufacturing steps for the HBT.

First, as shown in FIG. 2, on a semi-insulating GaAs substrate 101, a high-concentration n-type GaAs layer 102 (concentration: $5.0 \times 10^{18}$ cm$^{-3}$, thickness: 500 nm), a low-concentration n-type GaAs layer 103 (concentration: $3.0 \times 10^{17}$ cm$^{-3}$, thickness: 700 nm), a high-concentration p-type GaAs layer 104 (concentration: $1.0 \times 10^{19}$ cm$^{-3}$, thickness: 100 nm), a low-concentration n-type AlGaAs layer 105 (Al composition ratio: 0.35, concentration: $5.0 \times 10^{17}$ cm$^{-3}$, thickness: 200 nm), a high-concentration n-type GaAs layer 106 (concentration: $5.0 \times 10^{18}$ cm$^{-3}$, thickness: 100 nm), and a high-concentration n-type InGaAs layer 107 (In composition ratio: 0.6, concentration: $2.0 \times 10^{19}$ cm$^{-3}$, thickness: 200 nm) are stacked by MBE (Molecular Beam Epitaxial) process or MOCVD (Metal Organic Chemical Vapor Deposition) process. Then, a desired photoresist pattern 20 is formed on the high-concentration n-type InGaAs layer 107. The concentrations, thicknesses and composition ratios are not limited to the above mentioned numerical values.

Figure 3:
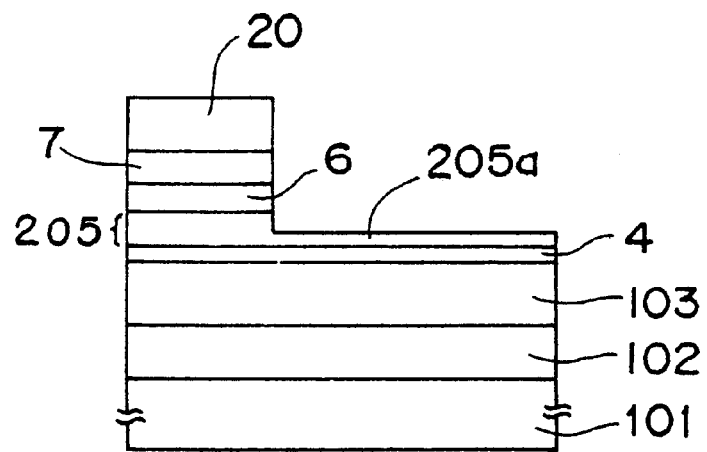
FIG. 3 is a view showing one of manufacturing steps for the HBT.

Next, with the photoresist pattern 20 used as a mask, the substrate is dipped in a phosphorus acid based etchant ($H_3PO_4$:$H_2O_2$:$H_2O$=3:1:50) controlled to 20° C. for 260 seconds. As a result, as shown in FIG. 3, the second emitter contact layer 7 and the first emitter contact layer 6 are formed, while part of the n-type AlGaAs layer 105 is etched, by which the AlGaAs layer 105 is formed into an AlGaAs layer 205. At one end of the AlGaAs layer 205, a 50 nm thick n-type AlGaAs layer 205a is formed. For this process, the etching time is set with care given to the fact that the etching rate differs among the high-concentration n-type InGaAs layer 107, the high-concentration n-type GaAs layer 106 and the n-type AlGaAs layer 105.

Figure 4:
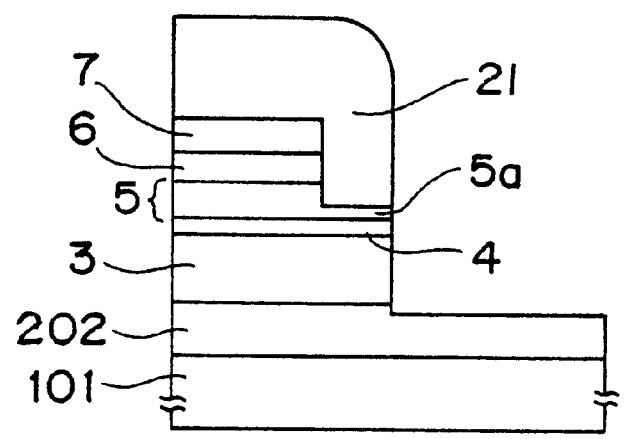
FIG. 4 is a view showing one of manufacturing steps for the HBT.

Then, after the photoresist pattern 20 is peeled off, a photoresist pattern 21 shown in FIG. 4 is formed so as to cover the second emitter contact layer 7 and part of the AlGaAs layer 205a. With the photoresist pattern 21 used as a mask, the substrate is dipped in a 20° C. phosphorus acid based etchant ($H_3PO_4$:$H_2O_2$:$H_2O$=3:1:50) for 570 seconds, by which an emitter layer 5, a base protective layer 5a which is part of the emitter layer 5, and a high-concentration n-type GaAs layer 202 whose surface has been partly etched to about 100 nm are formed. This high-concentration n-type GaAs layer 202 has part of the surface exposed.

Figure 5:
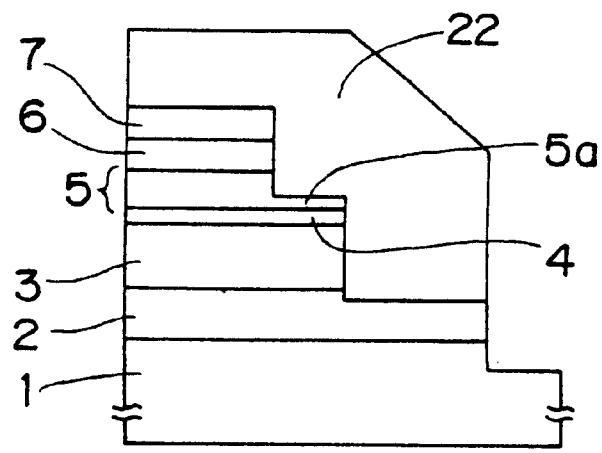
FIG. 5 is a view showing one of manufacturing steps for the HBT.

Next, after the photoresist pattern 21 is peeled off, a photoresist pattern 22 shown in FIG. 5 is formed so as to cover the second emitter contact layer 7, the base protective layer 5a and part of the high-concentration n-type GaAs layer 202. With the photoresist pattern 22 used as a mask, the substrate is dipped in a 20° C. phosphorus acid based etchant ($H_3PO_4$:$H_2O_2$:$H_2O$=3:1:50) for 570 seconds. As a result, exposed part of the high-concentration n-type GaAs layer 202 and part of the surface of the semi-insulating GaAs substrate 101 are etched to about 100 nm, by which a semi-insulating substrate 1 and a collector contact layer 2 are formed. At this time, part of the semi-insulating substrate 1 is securely exposed. In addition, whereas the phosphorus acid based etchant has been provided with a composition ratio of $H_3PO_4$:$H_2O_2$:$H_2O$=3:1:50 and at a temperature of 20° C., the phosphorus acid based etchant has only to be controllable and etchable in a desired amount, and is not particularly limited in composition ratio and temperature. Further, etchants of other compositions are also usable.

Figure 6:
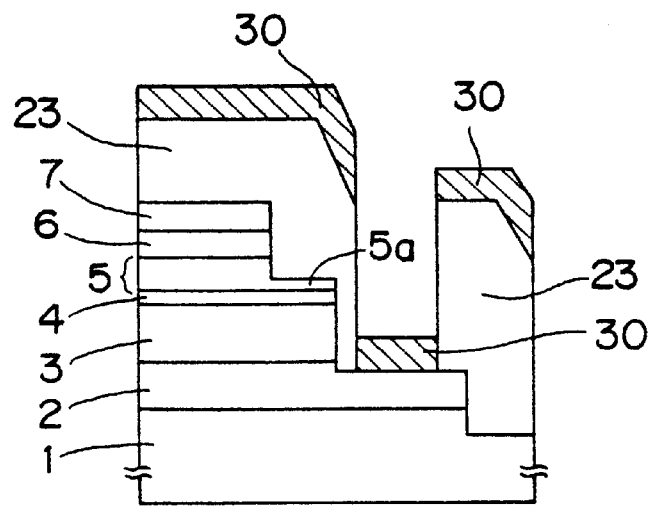
FIG. 6 is a view showing one of manufacturing steps for the HBT.
Figure 7:
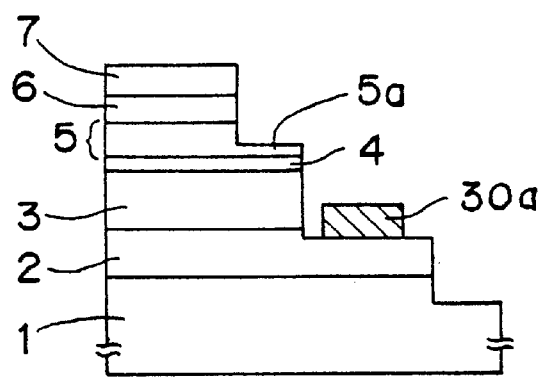
FIG. 7 is a view showing one of manufacturing steps for the HBT.

Next, after the photoresist pattern 22 is peeled off, as shown in FIG. 6, a photoresist pattern 23 is formed, and AuGe (thickness: 100 nm), Ni (thickness: 10 nm), Au(thickness: 100 nm) are continuously deposited by using an evaporator. As a result, on the photoresist pattern 23 and on the exposed part of the collector contact layer 2, a metal thin film 30 made of AuGe, Ni and Au is formed. Then, the photoresist pattern 23 is removed, by which only a necessary portion 30a of the metal thin film 30 is left as shown in FIG. 7.

Figure 8:
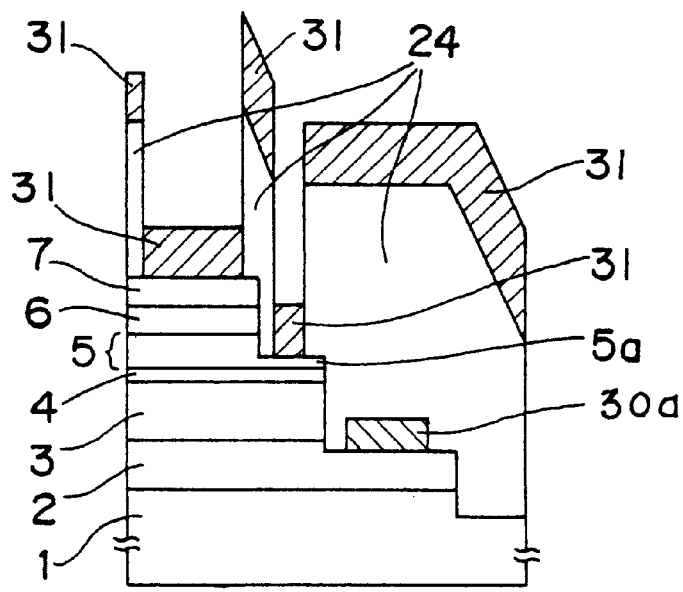
FIG. 8 is a view showing one of manufacturing steps for the HBT.
Figure 9:
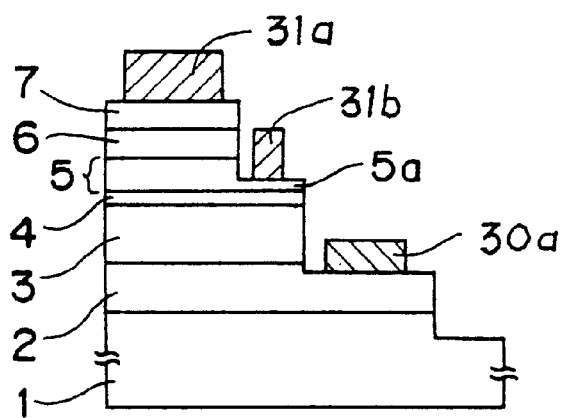
FIG. 9 is a view showing one of manufacturing steps for the HBT.

Next, as shown in FIG. 8, such a photoresist pattern 24 that desired portions of the second emitter contact layer 7 and the base protective layer 5a are exposed are formed. Then, Pt (thickness: 30 nm), Ti (thickness: 50 nm), Pt (thickness: 50 nm) and Au (thickness: 100 nm) as metal materials are continuously deposited by using an EB (Electron Beam) evaporator, by which a metal thin film 31 made of Pt, Ti, Pt and Au is formed. Then, the photoresist pattern 24 is peeled off, by which only necessary portions 31a, 31b of the metal thin film 31 are left as shown in FIG. 9.

Finally, heat treatment is performed in an $N_2$ atmosphere at 380° C. for 2 minutes, by which a collector ohmic electrode 11, a base ohmic electrode 10 and an emitter ohmic electrode 9 are formed as shown in FIG. 1. In this process, through the heat treatment, Pt is diffused from the portions 31a, 31b of the metal thin film 31 into the base protective layer 5a and the second emitter contact layer 7. As a result, a Pt alloyed reaction layer 13 is formed under the base ohmic electrode 10, and a Pt alloyed reaction layer 12 is formed under the emitter ohmic electrode 9.

Thus, by virtue of the arrangement that the base ohmic electrode 10 is made of Pt/Ti/Pt/Au and that the emitter ohmic electrode 9 is made of Pt/Ti/Pt/Au, the base ohmic electrode 10 and the emitter ohmic electrode 9 can be formed by one manufacturing step. As a result of this, the number of manufacturing steps is suppressed to a small one, so that the manufacturing cost can be reduced.

Figure 10:
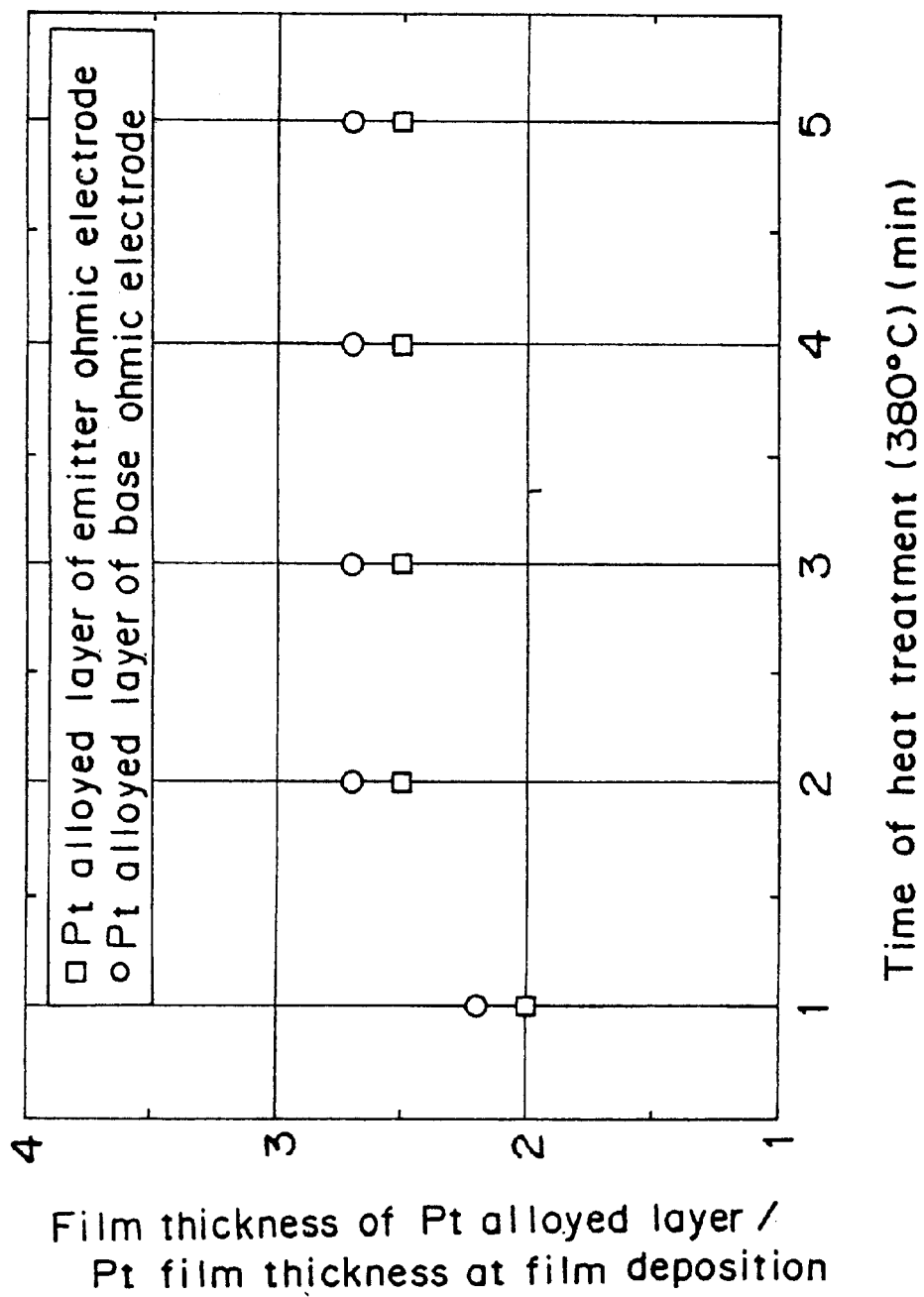
FIG. 10 is a view showing the ratios of Pt film thicknesses before heat treatment to the film thicknesses of Pt alloyed reaction layers.

FIG. 10 is a view showing the ratios of thicknesses of the Pt alloyed reaction layers 12, 13 formed under the emitter ohmic electrode 9 and the base ohmic electrode 10 by the heat treatment to the Pt film thicknesses before the heat treatment. The heat treatment is performed at 380° C. This is based on the fact that a heat treatment temperature of 350° C.–400° C. is required when the collector ohmic electrode 11 to be formed on the collector contact layer 2 is made of AuGe based metal, which is widely used, and the fact that it is intended to perform both heat treatments for forming the collector ohmic electrode 11 and for forming the base ohmic electrode 10 and the emitter ohmic electrode 9 at one time.

It has been found, as shown in FIG. 10, that Pt that makes the lowermost layer of the emitter ohmic electrode 9, after subjected to the heat treatment, forms the alloyed reaction layers 12, 13 that are about 2.5 times thicker than Pt film thicknesses before the heat treatment, and besides that further heat treatment, if applied, would not cause any change in those film thicknesses. Accordingly, forming the second emitter contact layer 7 three or more times thicker than the Pt film before heat treatment makes it possible to prevent the alloyed reaction layer 12 under the emitter ohmic electrode 9 from penetrating through the second emitter contact layer 7 so that a successful ohmic contact can be obtained.

It is essential to cover part of the surface of the base layer 4 with the base protective layer 5a from the viewpoint of securing the reliability. The film thickness of this base protective layer 5a should have a film thickness that satisfies the function as a protective layer and that fulfills a complete depletion in device operation. With considerations given to this, it is necessary to first determine the film thickness of the base protective layer 5a and then determine the film thickness of Pt that makes the lowermost layers of the emitter ohmic electrode 9 and the base ohmic electrode 10.

Figure 11:
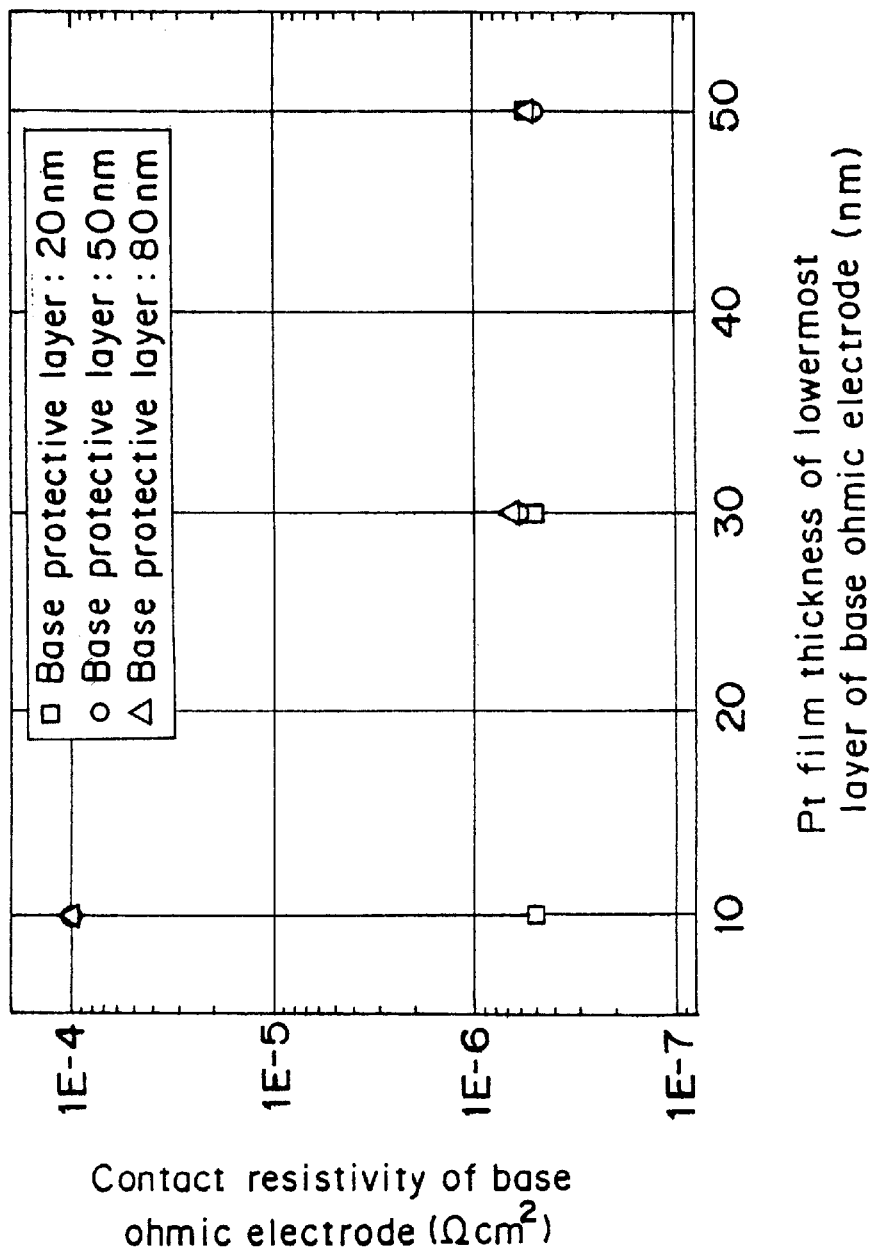
FIG. 11 is a graph showing the relationship between the film thickness of Pt before heat treatment and the contact resistivity of the base ohmic electrode after heat treatment.

FIG. 11 is a graph showing the relationship between the film thickness of Pt before heat treatment and the contact resistivity of the base ohmic electrode 10 after heat treatment. In this case, the film thickness of the base protective layer 5a is varied as 20 nm, 50 nm and 80 nm. In addition, the film thickness of the base layer 4 is 100 nm and a 380° C. heat treatment is performed for 2 minutes.

As shown in FIG. 11, if the film thickness of Pt before heat treatment that makes the lowermost layer of the base ohmic electrode 10 is less than ½ of the film thickness of the base protective layer 5a, the contact resistivity of the base ohmic electrode 10 to be formed by the subsequent heat treatment increases. Also, if the film thickness of Pt before heat treatment that makes the lowermost layer of the base ohmic electrode 10 is thicker than ⅓ of {film thickness of base protective layer 5a+film thickness of base layer 4}, then the alloyed reaction layer 13 to be formed by the subsequent heat treatment penetrates through the base layer 4 to reach the collector layer 3. This means that a metal penetrates through the PN junction plane of base and collector, which incurs a major fault as a transistor. Accordingly, it has been found out that the contact resistivity of the base ohmic electrode 10 can be reduced and moreover the Pt alloyed reaction layer 13 formed by heat treatment can be prevented from penetrating through the base layer 4 by setting the film thickness of Pt before heat treatment that makes the lowermost layers of the base ohmic electrode 10 and the emitter ohmic electrode 9 to within the range defined by the following relational expression:

(film thickness of the base protective layer $5a \times \frac{1}{2}$)<film thickness of the Pt before heat treatment<{(film thickness of the base protective layer+film thickness of the base layer)$\times \frac{1}{3}$}

Accordingly, by setting the film thickness of Pt before heat treatment that makes the lowermost layers of the base ohmic electrode 10 and the emitter ohmic electrode 9 to within the range defined by the above relational expression and besides by forming the second emitter contact layer 7 to a film thickness three or more times larger than the Pt film before heat treatment that makes the lowermost layers of the emitter ohmic electrode 9 and the base ohmic electrode 10, successful ohmic contacts of the emitter ohmic electrode 9 and the base ohmic electrode 10 can securely be obtained even if the emitter ohmic electrode 9 and the base ohmic electrode 10 are formed simultaneously.

Figure 12:
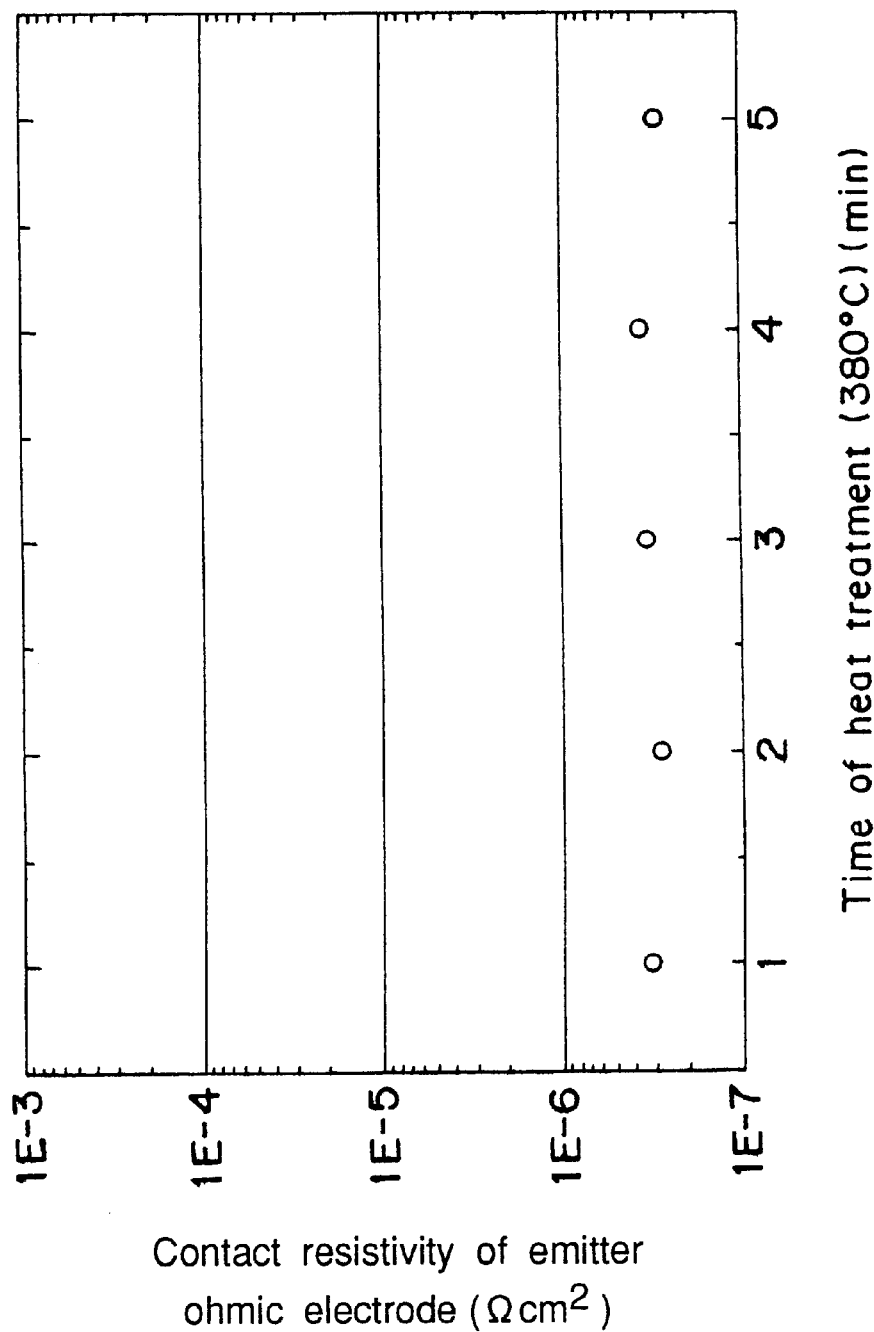
FIG. 12 is a graph showing the relationship between the contact resistivity of the emitter electrode subjected to excessive heat treatment and the heat treatment time.
Figure 13:
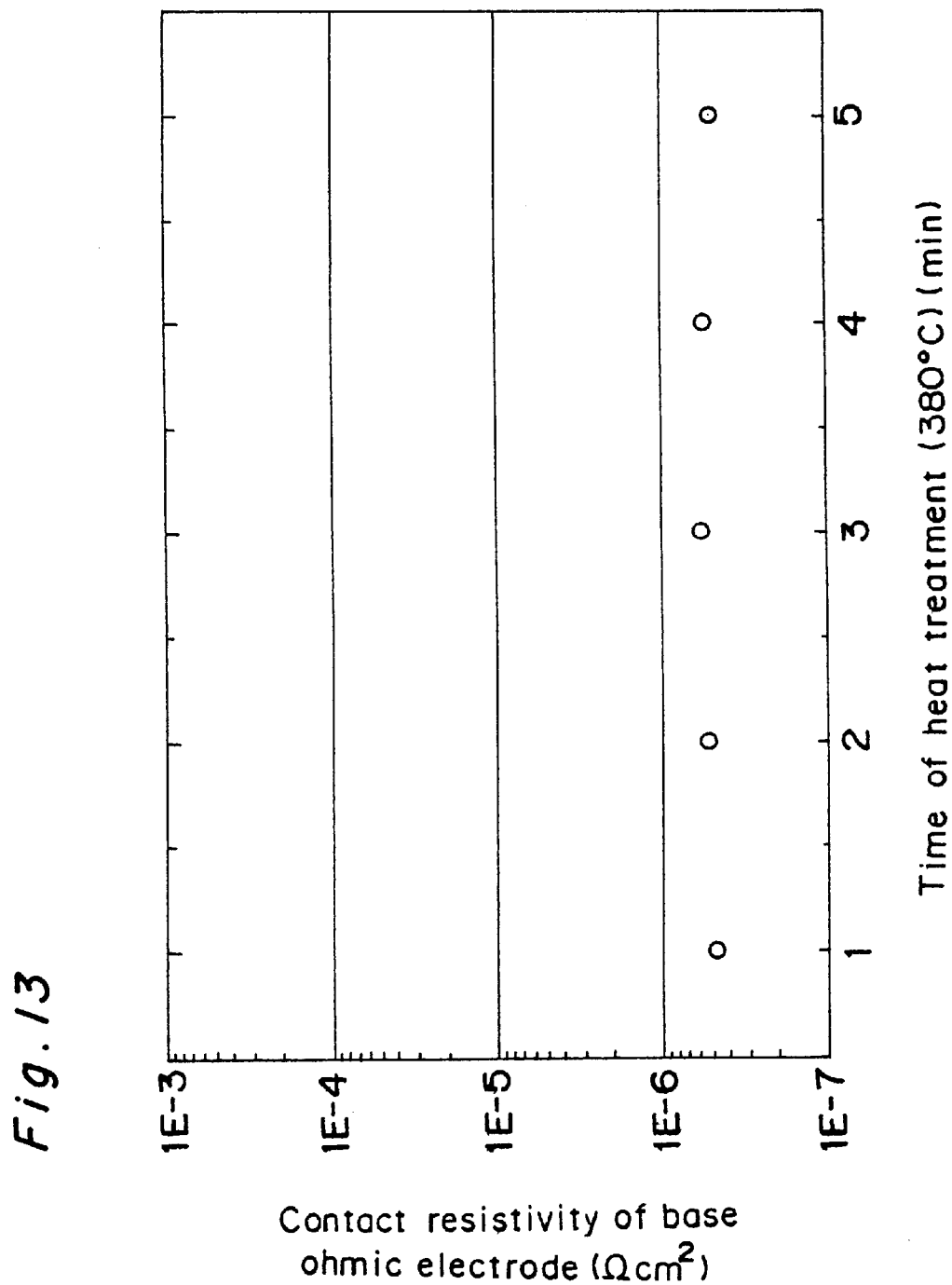
FIG. 13 is a graph showing the relationship between the contact resistivity of the base electrode subjected to excessive heat treatment and the heat treatment time.
Figure 14:
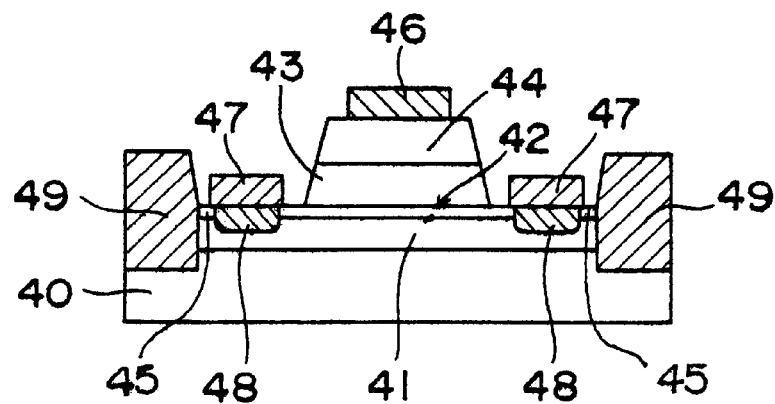
FIG. 14 is a schematic sectional, structural view of main part of the HBT disclosed in Reference, S. Hongo et al., SSDM, 1994, pp. 613–615.
Figure 15:
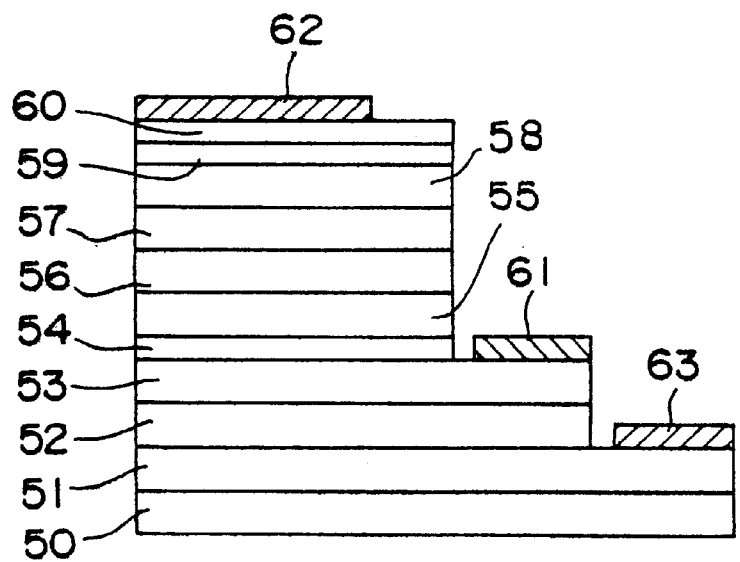
FIG. 15 is a schematic sectional view of main part of the HBT disclosed in Reference, E Zanoni et al., IEEE Device Letters, Vol. 13, No. 5, May 1992.
Figure 16A:
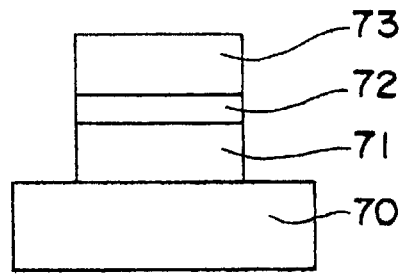
FIG. 16A is a schematic sectional view of the ohmic electrode disclosed in Japanese Patent Laid-Open Publication HEI 8-222526.
Figure 16B:
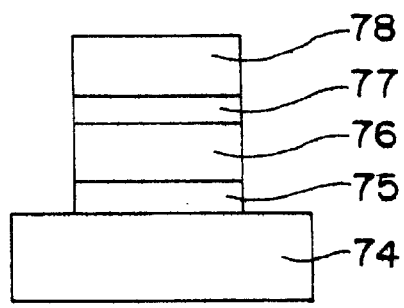
FIG. 16B is a view showing one of modifications of the ohmic electrode.
Figure 16C:
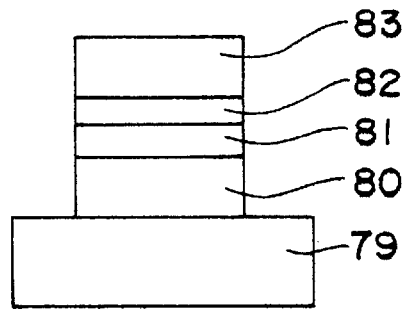
FIG. 16C is a view showing one of modifications of the ohmic electrode.

FIG. 12 shows the heat treatment dependence of the contact resistivity of the emitter ohmic electrode 9 subjected to excessive heat treatment and the heat treatment time. FIG. 13 shows the heat treatment dependence of the contact resistivity of the base ohmic electrode 10 subjected to excessive heat treatment and the heat treatment time. As can be seen from FIGS. 12 and 13, the contact resistivities of the emitter ohmic electrode 9 and the base ohmic electrode 10 are on the order of $10^{-7} \Omega \cdot cm^2$ regardless of the time of heat treatment. Accordingly, it can be understood that successful ohmic contacts are obtained and that the ohmic electrodes are stable thermally as well.

Although the emitter structure is a one-finger structure in this embodiment, the structure may also be a so-called multi-finger structure in which a plurality of emitter fingers.

Although one ohmic electrode is formed for each of the emitter layer 5, the base layer 4 and the collector layer 3, neither configuration nor quantity of the electrodes is limited to those of the embodiment.

The film thickness of the base protective layer 5a has been set to 50 nm. This film thickness of the base protective layer 5a is such an example that the function as a protective layer is satisfied and that a complete depletion is fulfilled in device operation.

Further, although the emitter ohmic electrode 9 and the base ohmic electrode 10 have been formed each of a plurality of layers, the emitter ohmic electrode and the base ohmic electrode may also be formed each of a single layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heterojunction bipolar transistor comprising:
    a low-concentration n-type collector layer formed on a semi-insulating substrate;
    a high-concentration p-type base layer formed on the collector layer;
    a low-concentration n-type emitter layer formed on the base layer;
    a base ohmic electrode which is made of a single layer or a plurality of layers and which is formed on a base protective layer that is a portion of the emitter layer;
    a high-concentration n-type emitter contact layer formed so as to cover regions of the emitter layer except the base protective layer;
    an emitter ohmic electrode which is made of a single layer or a plurality of layers and which is formed on the emitter contact layer;
    a base-use alloyed reaction layer formed under the base ohmic electrode, and an emitter-use alloyed reaction layer formed under the emitter ohmic electrode; and
    wherein the base-use alloyed reaction layer extends through the base protective layer so as to reach the base layer and the emitter-use alloyed reaction layer is formed only within the emitter contact layer so that the emitter-use alloyed reaction layer does not reach the emitter layer.

2. The heterojunction bipolar transistor according to claim 1, wherein
    the base ohmic electrode and the emitter ohmic electrode are made of an identical material.

3. The heterojunction bipolar transistor according to claim 1, wherein
    the emitter contact layer is composed of a first emitter contact layer and a second emitter contact layer formed on the first emitter contact layer;
    carrier concentration of the second emitter contact layer is set so as to be higher than carrier concentration of the first emitter contact layer; and
    the emitter-use alloyed reaction layer is formed only within the second emitter contact layer.

4. The heterojunction bipolar transistor according to claim 1, wherein
    the collector layer and the base layer are formed of GaAs and the emitter layer and the base protective layer are formed of AlGaAs.

5. The heterojunction bipolar transistor according to claim 1, wherein
    the first emitter contact layer is formed of GaAs and the second emitter contact layer is formed of InGaAs.

6. The heterojunction bipolar transistor according to claim 1, wherein
    the base ohmic electrode and the emitter ohmic electrode, or a lowermost layer of the base ohmic electrode and a lowermost layer of the emitter ohmic electrode are made of Pt; and
    the base-use alloyed reaction layer and the emitter-use alloyed reaction layer contain Pt.

7. A method for manufacturing the heterojunction bipolar transistor as defined in claim 3, comprising the steps of:
    stacking, on the base protective layer and the second emitter contact layer, an electrode material that makes the base ohmic electrode and the emitter ohmic electrode, or an electrode material Pt that makes a lowermost layer of the base ohmic electrode and a lowermost layer of the emitter ohmic electrode, so that a film thickness of the electrode material becomes thinner than a film thickness of the second emitter contact layer; and
    subjecting the electrode material to a heat treatment to form the base ohmic electrode on the base protective layer and form the emitter ohmic electrode on the second emitter contact layer.

8. The method for manufacturing the heterojunction bipolar transistor according to claim 7, wherein the film thickness of the second emitter contact layer is set to three or more times the film thickness of the electrode material Pt.

9. The method for manufacturing the heterojunction bipolar transistor according to claim 7, wherein the film thickness of the electrode material is within a range defined by a following relational expression:

(film thickness of the base protective layer×½)<film thickness of the electrode material before heat treatment<{(film thickness of the base protective layer+film thickness of the base layer)×⅓}.

10. The transistor of claim 1, wherein the emitter contact layer comprises first and second emitter contact layers and the second emitter contact layer has a higher concentration than the first emitter contact layer, and wherein the emitter-use alloyed reaction layer extends at least part way through the second emitter contact layer but does not extend through any portion of the first emitter contact layer.

11. A heterojunction bipolar transistor comprising:

a collector layer supported by a substrate;

a base layer formed over the collector layer;

an emitter layer;

a base electrode in communication with the base layer and which is formed over a base protective layer that is at least a portion of the emitter layer;

at least one emitter contact layer formed so as to at least partially cover a region of the emitter layer;

an emitter electrode formed over the emitter contact layer;

a base-use alloyed reaction layer formed at least partially under the base electrode, an emitter-use alloyed reaction layer formed at least partially under the emitter electrode; and wherein the base-use alloyed reaction layer extends through the base protective layer so as to reach the base layer and the emitter-use alloyed reaction layer is formed only within the emitter contact layer so that the emitter-use alloyed reaction layer does not reach the emitter layer.

12. The transistor of claim 11, wherein the emitter contact layer comprises first and second emitter contact layers and the second emitter contact layer has a higher concentration than the first emitter contact layer, and wherein the emitter-use alloyed reaction layer extends at least part way through the second emitter contact layer but does not extend through any portion of the first emitter contact layer.

* * * * *